US008816510B2

(12) United States Patent
Matsui et al.

(10) Patent No.: US 8,816,510 B2
(45) Date of Patent: Aug. 26, 2014

(54) SEMICONDUCTOR APPARATUS, SUBSTRATE DESIGN METHOD, AND SUBSTRATE DESIGN APPARATUS

(75) Inventors: Noriyuki Matsui, Kawasaki (JP); Hidehisa Sakai, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 895 days.

(21) Appl. No.: 12/567,893

(22) Filed: Sep. 28, 2009

(65) Prior Publication Data

US 2010/0078810 A1   Apr. 1, 2010

(30) Foreign Application Priority Data

Sep. 30, 2008   (JP) ................. 2008-252348

(51) Int. Cl.
*H01L 23/48* (2006.01)
*H01L 23/52* (2006.01)
*H01L 23/498* (2006.01)
*H01L 23/367* (2006.01)

(52) U.S. Cl.
CPC ....... *H01L 23/49816* (2013.01); *H01L 23/3677* (2013.01); *H01L 23/49827* (2013.01); *H01L 23/49838* (2013.01); *H01L 2924/15311* (2013.01)
USPC ........... 257/780; 257/774; 257/773; 257/786; 257/E23.011

(58) Field of Classification Search
CPC ............ H01L 23/0652; H01L 23/06513; H01L 23/49816; H01L 23/49827
USPC ................. 257/774, 773, 786, 780, E23.011
See application file for complete search history.

(56) References Cited

U.S. PATENT DOCUMENTS

| 4,893,216 | A | * | 1/1990 | Hagner | 361/774 |
| 4,912,603 | A | * | 3/1990 | Seyama | 361/777 |
| 5,216,278 | A | * | 6/1993 | Lin et al. | 257/688 |
| 5,379,191 | A | * | 1/1995 | Carey et al. | 361/777 |
| 5,450,290 | A | * | 9/1995 | Boyko et al. | 361/792 |
| 5,703,402 | A | * | 12/1997 | Chu et al. | 257/737 |
| 5,784,262 | A | * | 7/1998 | Sherman | 361/777 |
| 5,952,726 | A | * | 9/1999 | Liang | 257/778 |
| 6,057,596 | A | * | 5/2000 | Lin et al. | 257/697 |

(Continued)

FOREIGN PATENT DOCUMENTS

| JP | 8-222654 A | 8/1996 |
| JP | 2000-077556 A | 3/2000 |
| JP | 2001-015628 A | 1/2001 |
| JP | 2007-208153 A | 8/2007 |

(Continued)

OTHER PUBLICATIONS

Korean Office Action dated Mar. 11, 2011, issued in corresponding Korean Patent Application No. 10-2009-0091699.

(Continued)

*Primary Examiner* — Nitin Parekh
(74) *Attorney, Agent, or Firm* — Westerman, Hattori, Daniels & Adrian, LLP

(57) ABSTRACT

A semiconductor apparatus including: a substrate; and a semiconductor chip mounted on the substrate, wherein the substrate has plural holes, and the plural holes are provided such that the density on a substrate surface of the holes in a first area, which is an area of the substrate facing a semiconductor chip peripheral portion, is higher than the density on the substrate surface of the holes in an area excluding the first area on the substrate.

14 Claims, 14 Drawing Sheets

(56) References Cited

U.S. PATENT DOCUMENTS

| | | | |
|---|---|---|---|
| 6,064,113 A * | 5/2000 | Kirkman | 257/691 |
| 6,140,710 A * | 10/2000 | Greenberg | 257/786 |
| 6,285,086 B1 | 9/2001 | Sota et al. | |
| 6,465,743 B1 | 10/2002 | Owens | |
| 6,710,265 B2 | 3/2004 | Owens | |
| 7,199,306 B2 | 4/2007 | Owens | |
| 7,397,001 B2 | 7/2008 | Owen | |
| 2005/0258519 A1 | 11/2005 | Kikuchi et al. | |

FOREIGN PATENT DOCUMENTS

| | | |
|---|---|---|
| KR | 2005-0111515 A | 11/2005 |
| WO | 2006/100759 A1 | 9/2006 |

OTHER PUBLICATIONS

Japanese Office Action mailed May 8, 2012, issued in corresponding Japanese Patent Application No. 2008-252348, w/ partial English translation.

* cited by examiner

US 8,816,510 B2

SEMICONDUCTOR APPARATUS, SUBSTRATE DESIGN METHOD, AND SUBSTRATE DESIGN APPARATUS

CROSS REFERENCE TO RELATED APPLICATION

This application is based upon and claims the benefit of priority from the prior Japanese Patent Application NO. 2008-252348 filed on Sep. 30, 2008, the entire contents of which are incorporated herein by reference.

FIELD

The embodiments discussed herein are related to semiconductor apparatus for mounting a semiconductor chip, substrate design methods, and substrate design apparatus, whereby a semiconductor chip is mountable on an external substrate through a substrate.

BACKGROUND

Many semiconductors each having many signal lines, such as SRAMs (Static Random Access Memories) and an ASIC (Application Specific Integrated Circuits) frequently use a BGA (Ball Grid Array) package.

A semiconductor package typically such as a BGA package may be produced by a method that primarily mounts a silicon chip on a resin substrate and secondarily mounts it on a printed substrate through solder balls.

Technologies in the past include technologies that reduces the stress against the semiconductor package (refer to patent Document 1, patent Document 2, and patent Document 3).
[Patent Document 1]
International Publication Pamphlet No. WO 2006/100759
[Patent Document 2]
Japanese Patent No. 3919353
[Patent Document 3]
Japanese Patent No. 3493088

However, after the secondary mounting, the difference in thermal expansion coefficient between the substrate and the silicon causes intensive stress against the solder balls and/or solder pads at ends of the silicon chip, resulting in soldering peel during a temperature cycle test, for example.

SUMMARY

According to an aspect of the embodiments, a semiconductor apparatus including a substrate and a semiconductor chip mounted on the substrate, wherein the substrate has plural holes, the plural holes are provided such that the density on a substrate surface of the holes in a first area, which is an area of the substrate facing a semiconductor chip peripheral portion, is higher than the density on the substrate surface of the holes in an area excluding the first area on the substrate.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

DESCRIPTION OF THE PREFERRED EMBODIMENTS

With reference to drawings, embodiments will be described below.

Comparison Example

A BGA package, which is a comparison example, will be described below.

Figure 1:
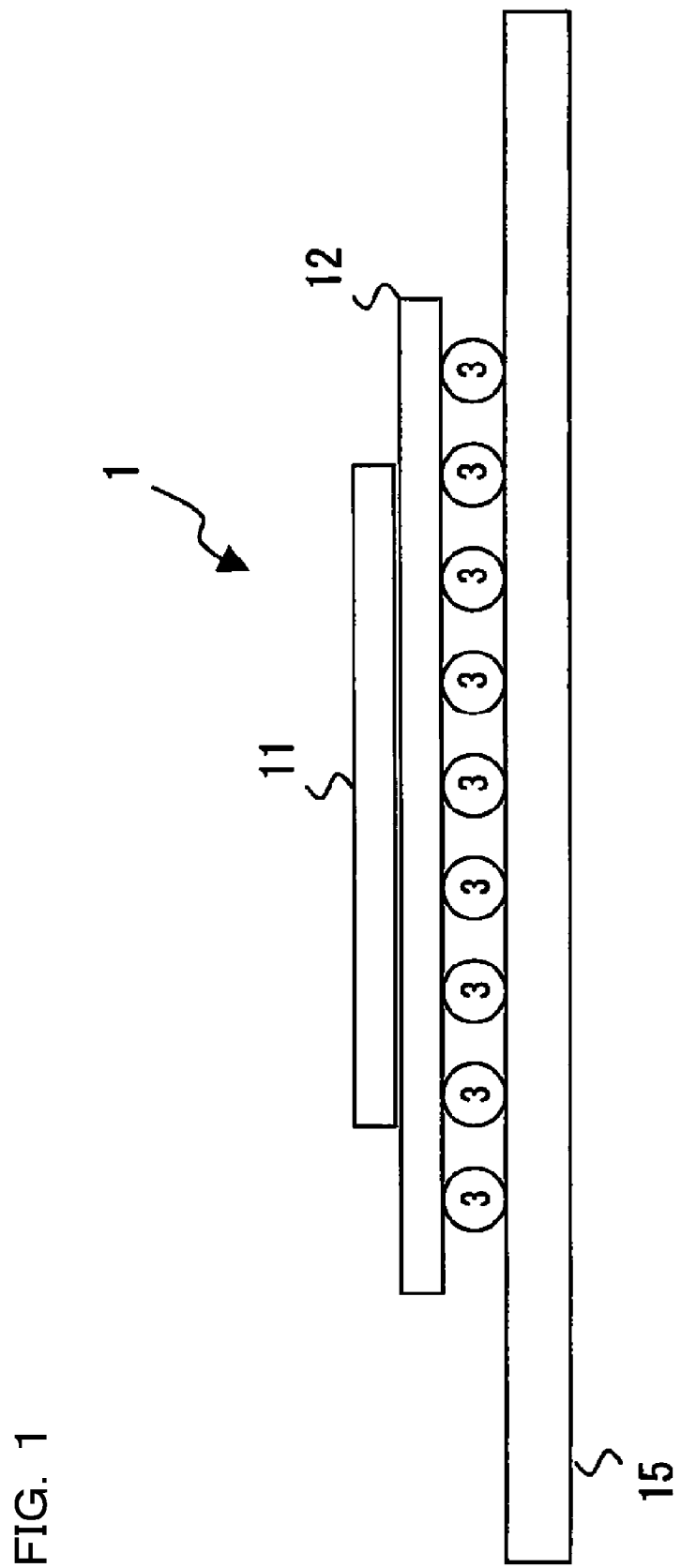
FIG. 1 is a section view illustrating an example of the configuration of a BGA package, which is a comparison example.

FIG. 1 is a section view illustrating an example of the configuration of a BGA package, which is a comparison example. The BGA package 1 illustrated in FIG. 1 includes a si (silicon) chip 11 (which is a semiconductor chip), a BGA substrate 12 (which may be a substrate, a resin substrate, or an interposer), and solder balls 3 (or bumps). The BGA package 1 is mounted on a substrate 15 (which may be an external substrate or a main substrate) through the solder balls 3.

Figure 2:
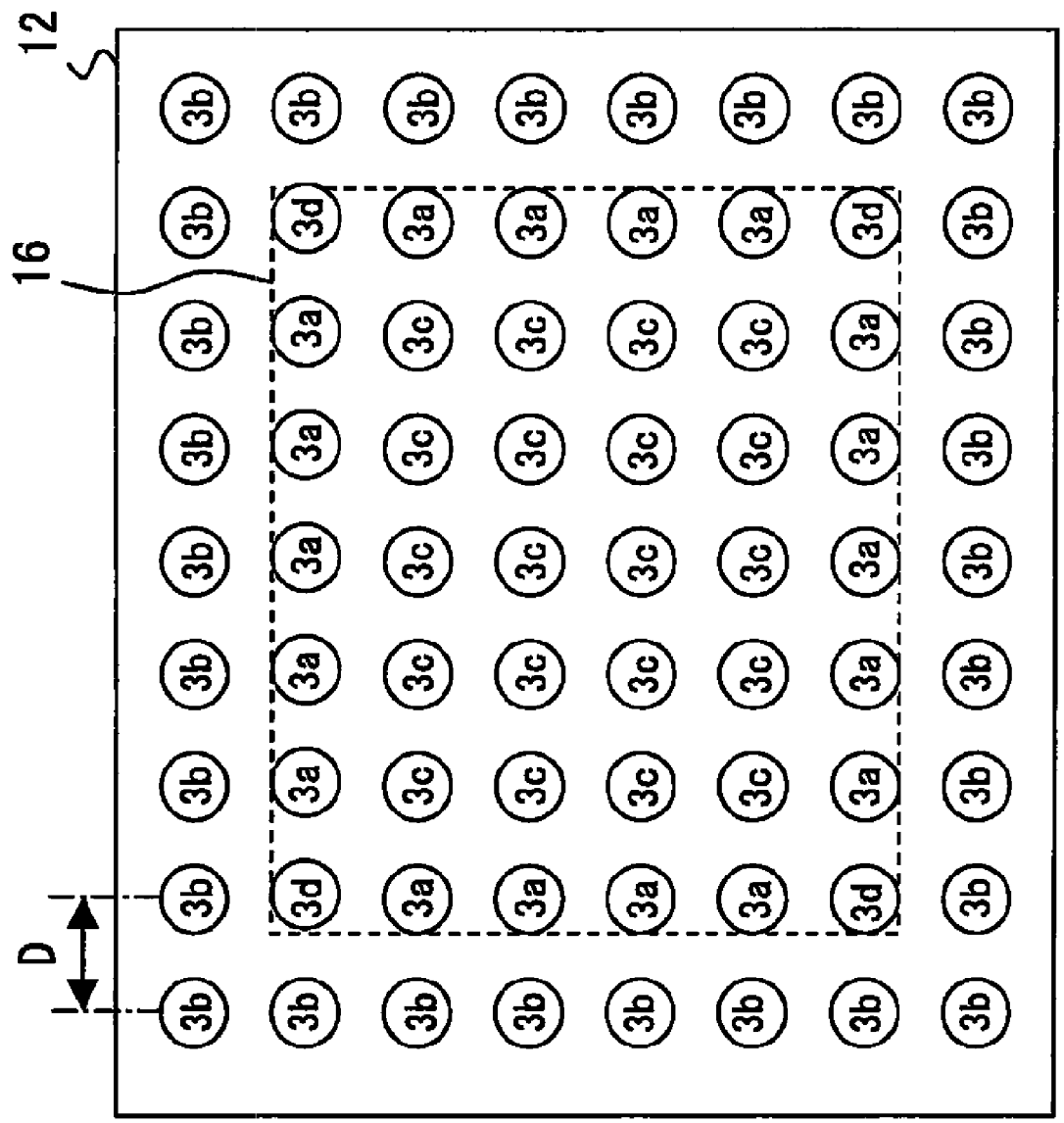
FIG. 2 is a bottom view of an example of the configuration of the BGA substrate, which is the comparison example.

FIG. 2 is a bottom view of an example of the configuration of the BGA substrate, which is the comparison example. The BGA substrate 12 has a bottom surface (on the mounted substrate 15 side) having the solder balls 3 in a matrix form. Here, on the BGA substrate 12, the area on the bottom surface, which is the back of the area having the chip 11, is called chip area 16. The circumference of the chip area 16 is called chip boundary (first boundary). The solder balls 3 include solder balls 3$d$, which are inside of the chip boundary and are the closest to the apexes of the chip boundary, solder balls 3$a$, which are the outermost of the inside of the chip boundary, excluding the solder balls 3$d$, solder balls 3$b$, which are more outside than the solder balls 3$a$, and solder balls 3$c$, which are more inside than the solder balls 3$a$ and 3$d$.

The result of a heat stress analysis on the BGA package 1 will be described below.

The heat stress analysis assumed a temperature cycle test and increased the temperature of the entire BGA package 1 and calculated the distortions of the solder balls 3.

Figure 3:
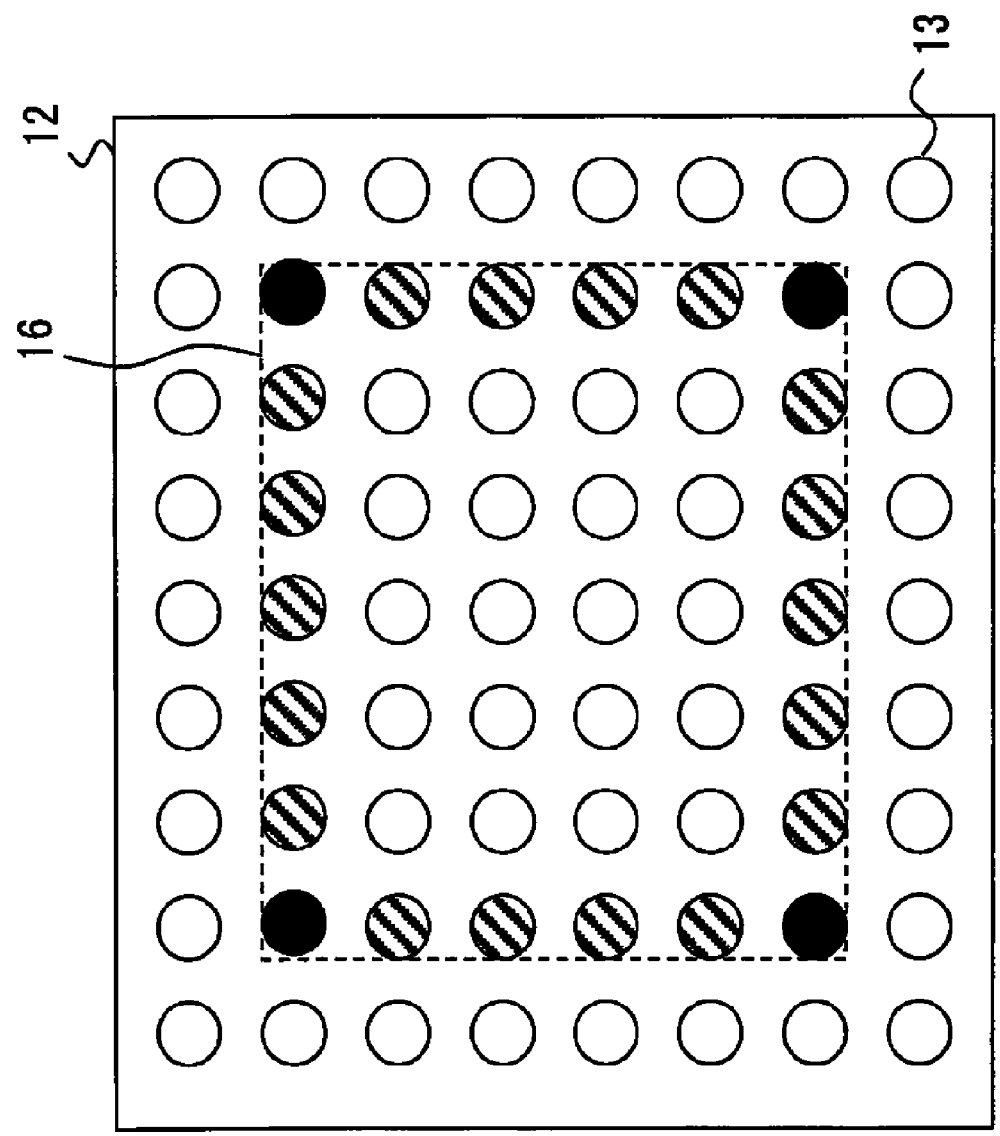
FIG. 3 is a bottom view illustrating an example of the magnitudes of the distortion of the solder balls under the heat stress analysis on the BGA package, which is the comparison example.

FIG. 3 is a bottom view illustrating an example of the magnitudes of the distortion of the solder balls under the heat stress analysis. FIG. 3 illustrates the identical layout of the BGA substrate 12 and the solder balls 3a, 3b, 3c, and 3d to that in FIG. 2. Here, the solder balls 3a, 3b, 3c, and 3d are illustrated differently as white circles, shaded circles and black circles in increasing order of distortion.

Comparing the distortions of the solder balls 3a, 3b, 3c, and 3d, the distortions of the solder balls 3a, and 3d near the chip boundary were larger. This is because the thermal expansion coefficient of the BGA substrate 12 is higher than the thermal expansion coefficient of the chip 11. Furthermore, comparing the distortions of the solder balls 3a and 3d, the distortions of the solder balls 3d were the largest.

The distortions of the solder balls 3b were smaller. This is because the ratios of expansion and contraction of the BGA substrate 12 and the mounted substrate 15 are equal. The distortions of the solder balls 3c were smaller. This is because the expansion and contraction is suppressed by the chip 21.

As described above, the intensive distortions near the corners of the chip boundary of the BGA substrate 22 increased the damage on the solder balls 3d.

First Embodiment

Figure 4:
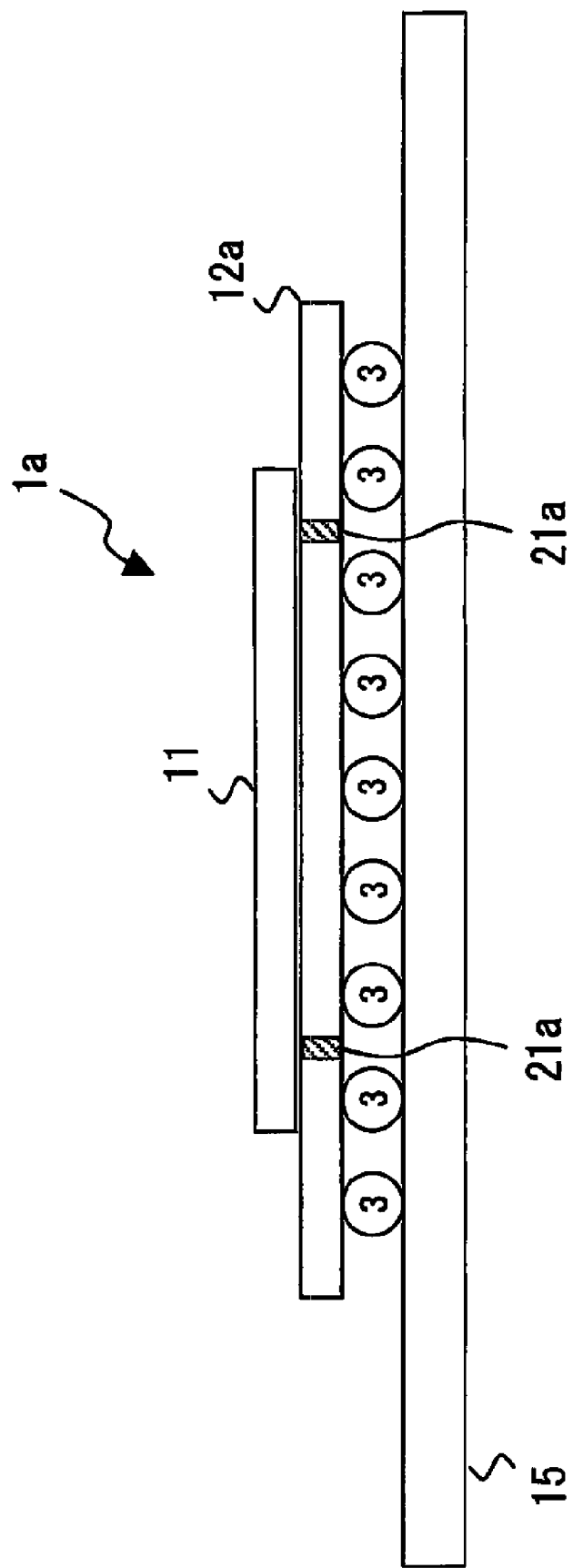
FIG. 4 is a section view illustrating an example of the configuration of a BGA package of a first embodiment.

FIG. 4 is a section view illustrating an example of the configuration of a BGA package of a first embodiment. In a BGA package 1a illustrated in FIG. 4, the same reference numerals as those in FIG. 1 are given to the same or equivalent components as those in FIG. 1, and the description thereon will be omitted herein. A BGA substrate 12a is similar to the BGA substrate 12 except for different holes.

Figure 5:
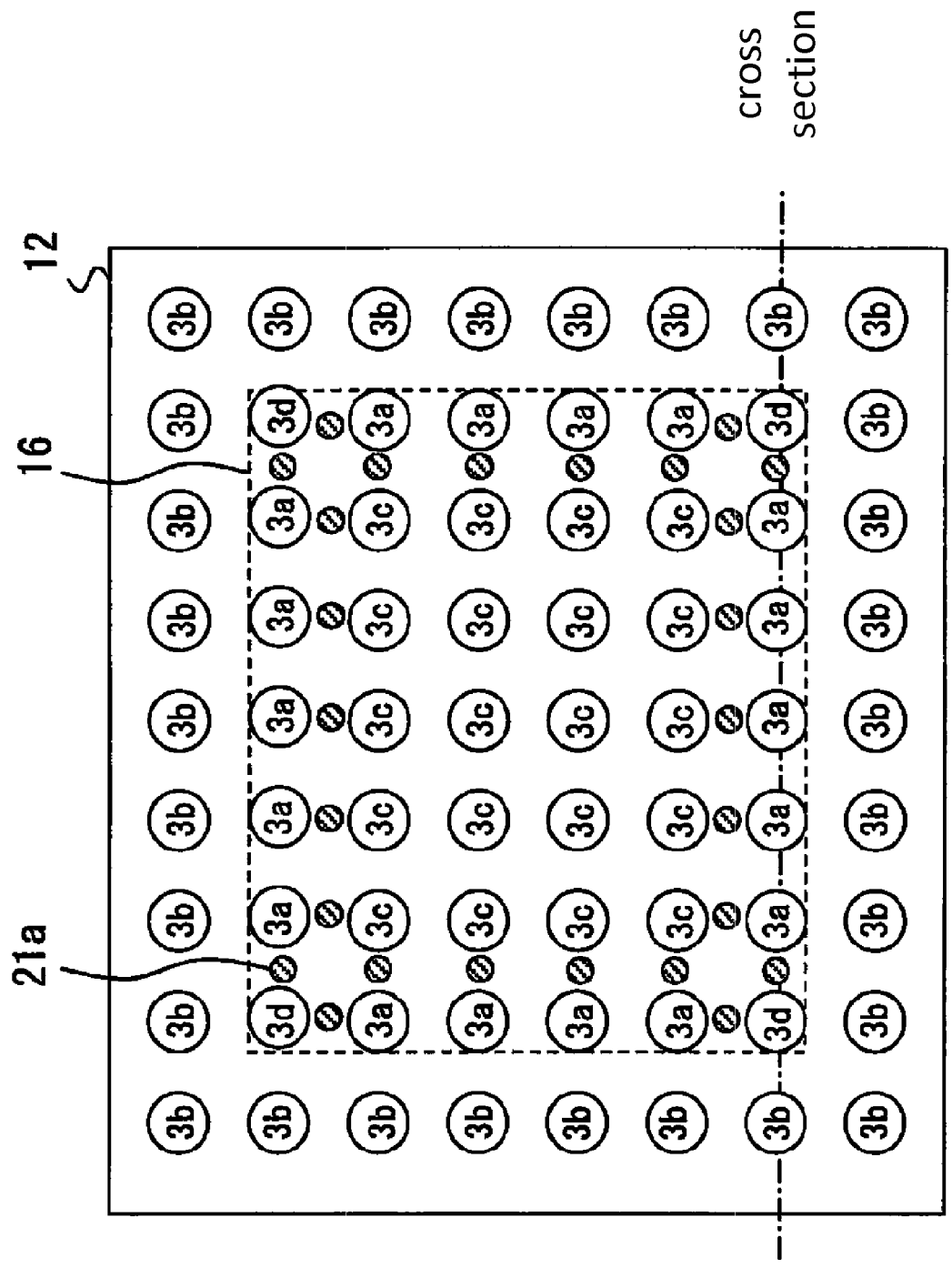
FIG. 5 is a bottom view illustrating an example of the configuration of a BGA substrate of the first embodiment.

FIG. 5 is a bottom view illustrating an example of the configuration of a BGA substrate of the first embodiment. In FIG. 5, the same reference numerals as those in FIG. 2 are given to the same or equivalent components as those in FIG. 2, and the description thereon will be omitted herein. Here, the distance between the solder balls 3a, 3b, 3c and 3d, which are neighboring to each other, is called solder ball distance D. FIG. 4 is a section view taken along the cut plane in FIG. 5.

In the BGA substrate 12a, through holes 21a are provided between the solder balls 3a and the solder balls 3c which are neighboring to the inner side. Through holes 21a are provided between the solder balls 3d and the solder balls 3a which are neighboring to them. In FIG. 4 and FIG. 5, the through holes 21a are indicated by the shaded circles.

Here, a part or all of the plural through hole 21a may have electrodes on their inner surface. In this case, the electrodes of the chip 11 and the solder balls 3 are wired through electrodes (or vias) of the through holes 21a. A through hole without an electrode, which is provided for reducing intensive stress and distortions, will be called dummy through hole in the following descriptions. Other through hole may be provided at positions excluding the positions of the through hole 21a.

The square formed by connecting the centers of the solder balls 3a and 3d, which are inside of the chip boundary and outermost, on the bottom surface of the BGA substrate 12a will be called solder ball boundary.

In the description according to this embodiment, the area which is inside of the solder ball boundary and has a distance equal to or shorter than the solder ball distance D (first distance) from the solder ball boundary is called chip peripheral area (first area). The area, which is within the chip peripheral area and has a distance equal to or shorter than the solder ball distance D from two sides, which are neighboring each other, of the solder ball boundary (second distance) (that is, the area which is within the chip peripheral area and is surrounded by the centers of four solder balls being neighboring to each other and including the solder ball 3d) will be called corner area (second area).

On the BGA substrate 12a, the layout of the through hole 21a as described above allows a higher density of the through holes in the chip peripheral area than the density of the through holes in the area excluding the chip peripheral area. Furthermore, on the BGA substrate 12a, the density of the through holes in the corner area may be higher than the density of the through holes in the chip peripheral area excluding the corner area. Here, in a specific area of the BGA substrate 12a, a total size of the openings of the through holes within the specific area to the size of the plane of the specific area will be called surface density of the through holes. In this case, on the BGA substrate 12a, the layout of the through holes 21a as described above allows a higher surface density of the through holes in the chip peripheral area than the surface density of the through holes in the area excluding the chip peripheral area. Furthermore, on the BGA substrate 12a, the surface density of the through holes in the corner area may be higher than the surface density of the through holes in the chip peripheral area excluding the corner area.

Notably, on the bottom surface of the BGA substrate 12a, the area having a distance equal to or shorter than the solder ball distance D from the chip boundary may be called chip peripheral area. The area having a distance equal to or shorter than the solder ball distance D from an apex of the chip peripheral area may be called corner area.

The layout of the through holes 21a as described above may reduce intensive stress and distortions on the chip boundary, particularly, near the corners of the chip boundary and may thus prevent the peel of the solder balls 3a and 3d.

A substrate design apparatus for designing the BGA substrate 12a and a BGA substrate design method with the substrate design apparatus will be described below.

Figure 6:
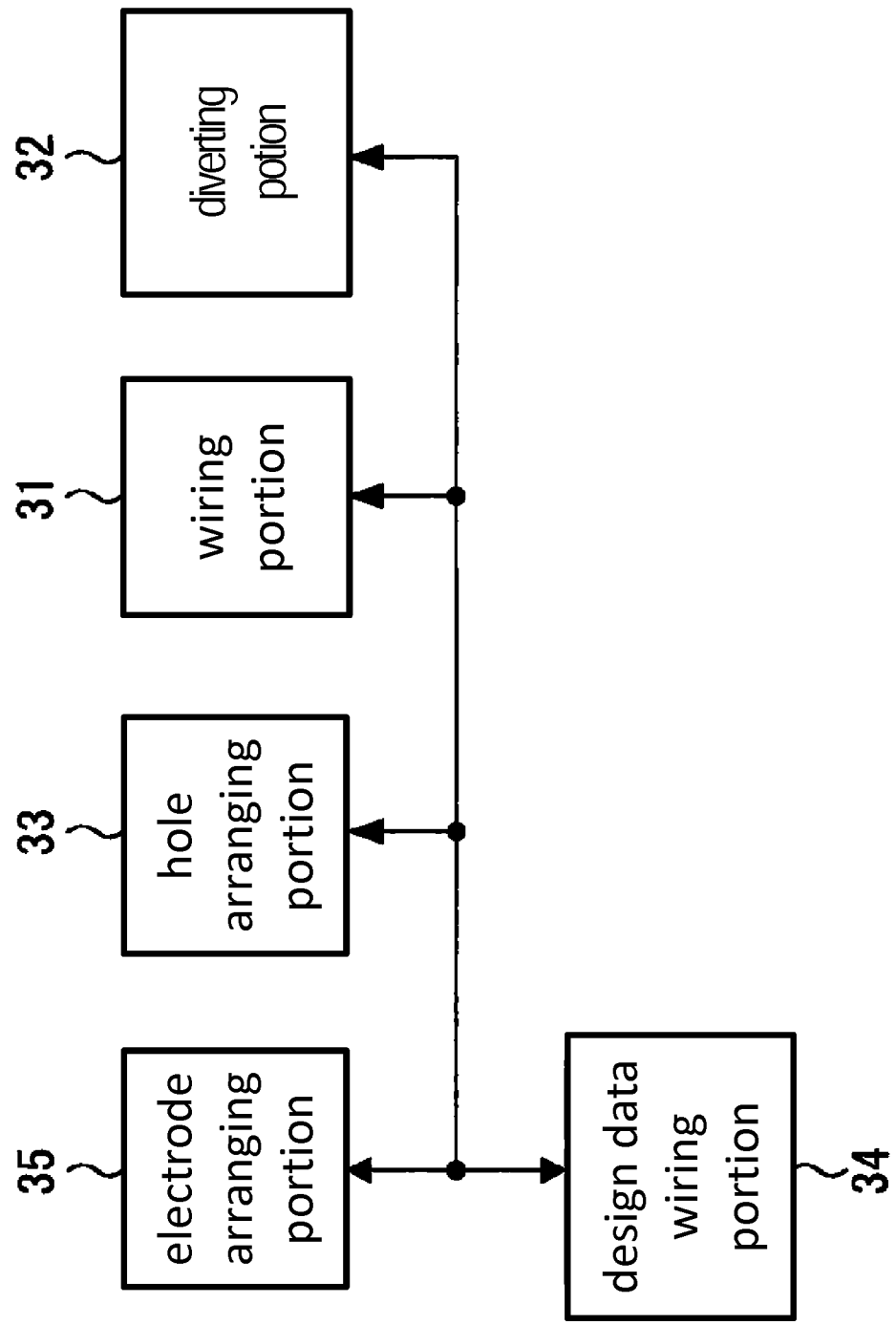
FIG. 6 is a block diagram illustrating an example of the configuration of a substrate design apparatus.

The BGA substrate 12a is designed by a substrate design apparatus. The substrate design apparatus may be implemented by a CAD (Computer Aided Design) system. FIG. 6 is a block diagram illustrating an example of the configuration of a substrate design apparatus according to the embodiment. The substrate design apparatus includes a wiring portion 31, a diverting portion 32, a hole arranging portion 33, a design data storage portion 34 and an electrode arranging portion 35. The electrode arranging portion 35 corresponds to the semiconductor chip position determining portion. The hole arranging portion 33 corresponds to the hole position determining portion.

The design data storage portion 34 stores design data on the BGA substrate 12a. The electrode arranging portion 35 determines the positions of the electrodes (first electrodes) on the top surface (first surface) of the BGA substrate 12a for connecting to a signal terminal of the chip 11 and the positions of the electrodes (second electrodes) on the bottom surface (second surface) of the BGA substrate 12a for connecting to the solder balls 3. Generally, the number of the electrodes on the top surface of the BGA substrate 12a is equal to the number of electrodes on the bottom surface of the BGA substrate 12a.

The wiring portion 31 defines in the design data on the BGA substrate 12 the positions of the connection routes (or wiring) from the signal terminals of the chip 11 to the solder balls 3. The hole arranging portion 33 defines in the design data on the BGA substrate 12 the positions of holes such as vias, through holes, dummy through holes and inner vias. The diverting portion 32 diverts a connection route so as to pass through the through holes and/or inner vias in the chip peripheral area to correct the position of the connection route thereby.

Figure 7:
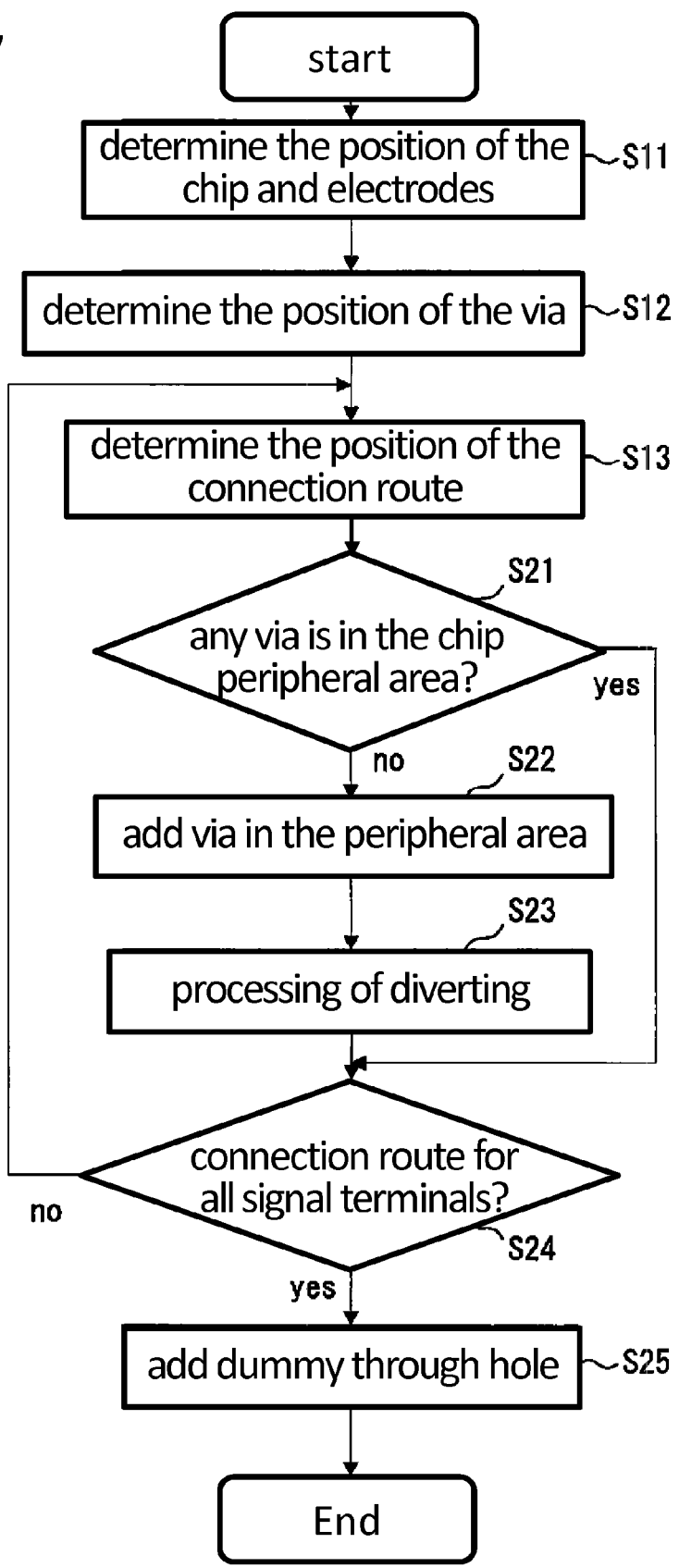
FIG. 7 is a flowchart illustrating an example of a BGA substrate design method.

FIG. 7 is a flowchart illustrating an example of a BGA substrate design method according to the embodiment. First of all, the electrode arranging portion 35 reads design data on the BGA substrate 12a, which is prestored in the design data storage portion 34, determines the positions of the chip 11 and solder balls 3 on the BGA substrate 12a and determines the positions of the electrodes on the top surface of the BGA substrate 12a and the positions of the electrodes on the bottom surface of the BGA substrate 12a (S11). Next, the hole arranging portion 33 determines the positions of the vias the number of which is equal to the number of electrodes on the surfaces such that they are arranged in a matrix form (S12).

Next, the wiring portion 31 selects one of the signal terminals of the chip 11 and determines the position of the connection route by a shortest distance from the selected signal terminal to the corresponding solder ball 3 (S13). Next, the hole arranging portion 33 determines whether the chip peripheral area has any via or not (S21).

If so (S21/yes), the flow moves to step S15. If not (S21/no), the hole arranging portion 33 adds vias at predetermined positions in the chip peripheral area (S22). Here, the predetermined positions in the chip peripheral area are the position of the through hole 21a.

Next, the diverting portion 32 performs diverting processing of diverting the connection route to pass through the vias (S23). Next, the wiring portion 31 determines whether the connection routes for all signal terminals have completely determined or not (S24).

If not (S24/no), the flow returns to step S13 where the wiring portion 31 selects the next signal terminal. If so (S24/yes), dummy through holes are added to the position with no through holes at the predetermined positions in the chip peripheral area (S25), and the flow ends.

The details of the diverting processing will be described below.

Figure 8:
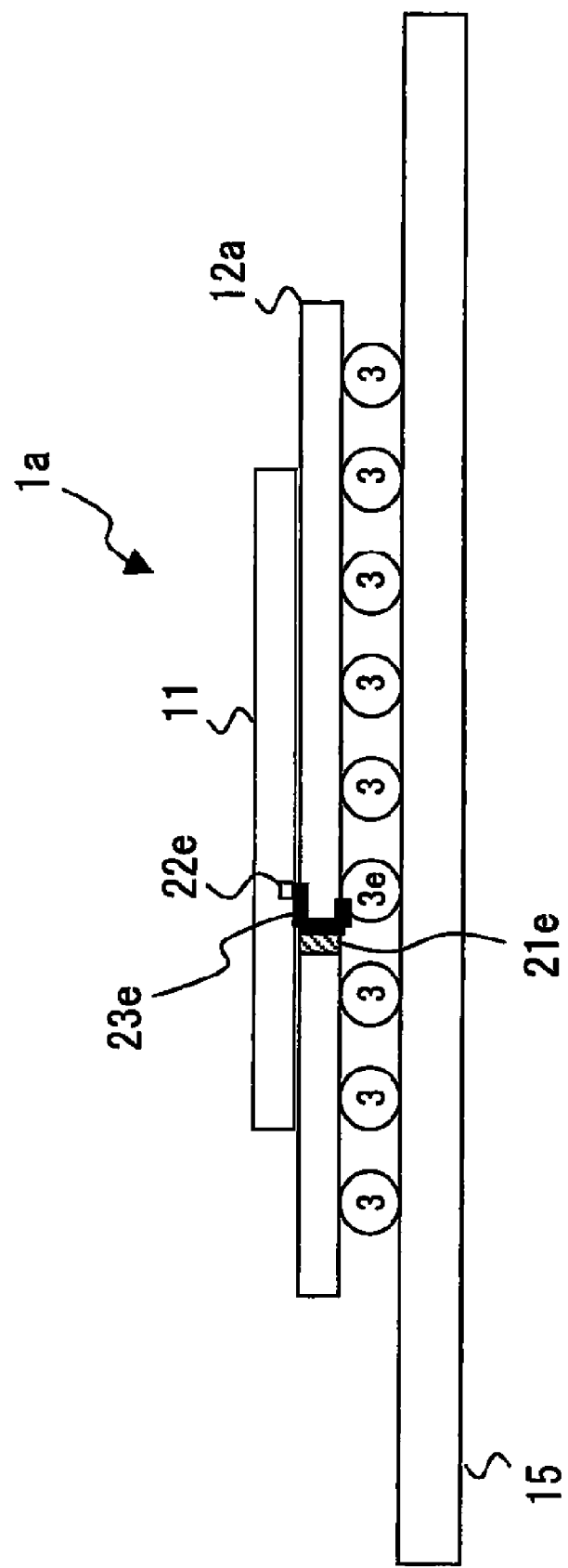
FIG. 8 is a section view illustrating an example of a connection route by a shortest distance on the BGA substrate.

FIG. 8 is a section view illustrating an example of a connection route by a shortest distance on the BGA substrate. In FIG. 8, the same reference numerals as those in FIG. 4 are given to the same or equivalent components as those in FIG. 4, and the description thereon will be omitted herein. Step S11 defines a connection route 22e by a shortest distance from a signal terminal 22e of the chip 11 to a solder ball 3e through a through hole 21e.

Figure 9:
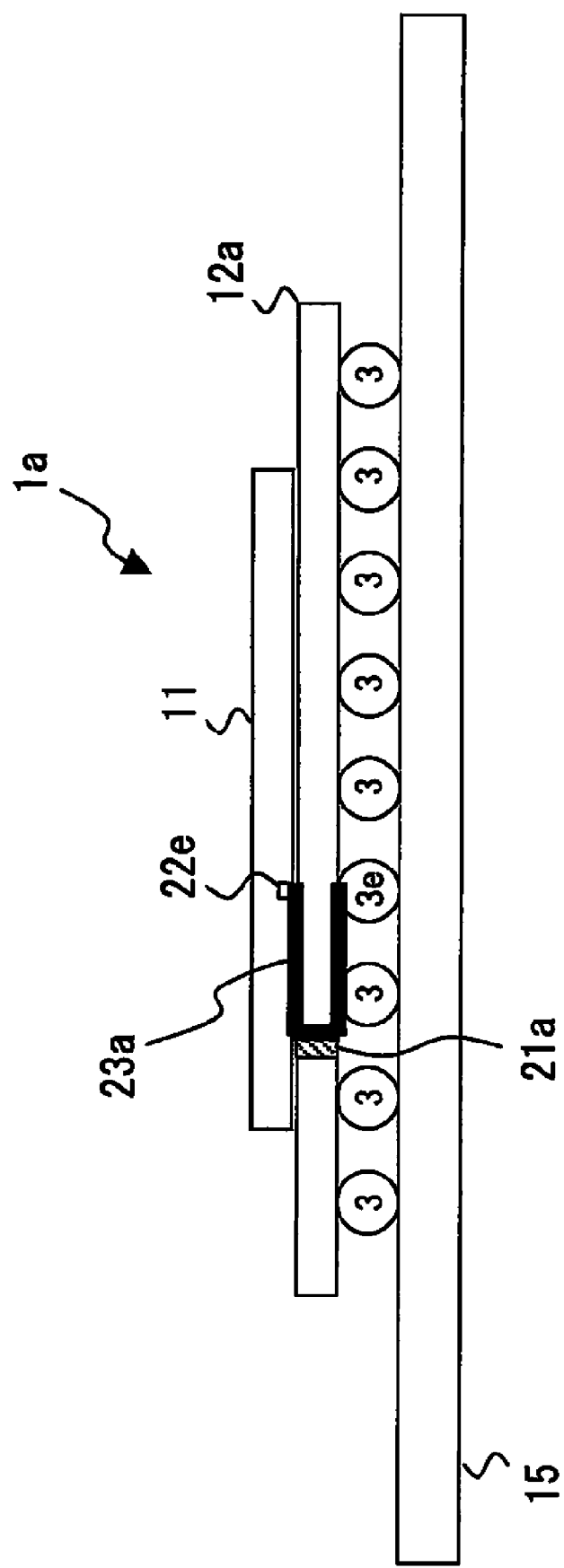
FIG. 9 is a section view illustrating an example of the connection route by the diverting processing.

FIG. 9 is a section view illustrating an example of the connection route by the diverting processing according to the embodiment. In FIG. 9, the same reference numerals as those in FIG. 4 are given to the same or equivalent components as those in FIG. 4, and the description thereon will be omitted herein. Step S23 changes the connection route 22e to a connection route 22a from a signal terminal 22e of the chip 11 to a solder ball 3e through the through hole 21a in the chip peripheral area. The distance of the connection route 22a is longer than the distance of the connection route 22e.

According to the BGA substrate design method, the wiring within the BGA substrate 12a connecting the signal terminals of the chip 11 and the solder balls 3 are defined to extend through vias in the chip peripheral area. Furthermore, dummy through holes for reducing the stress may be provided in the chip peripheral area.

Second Embodiment

Figure 10:
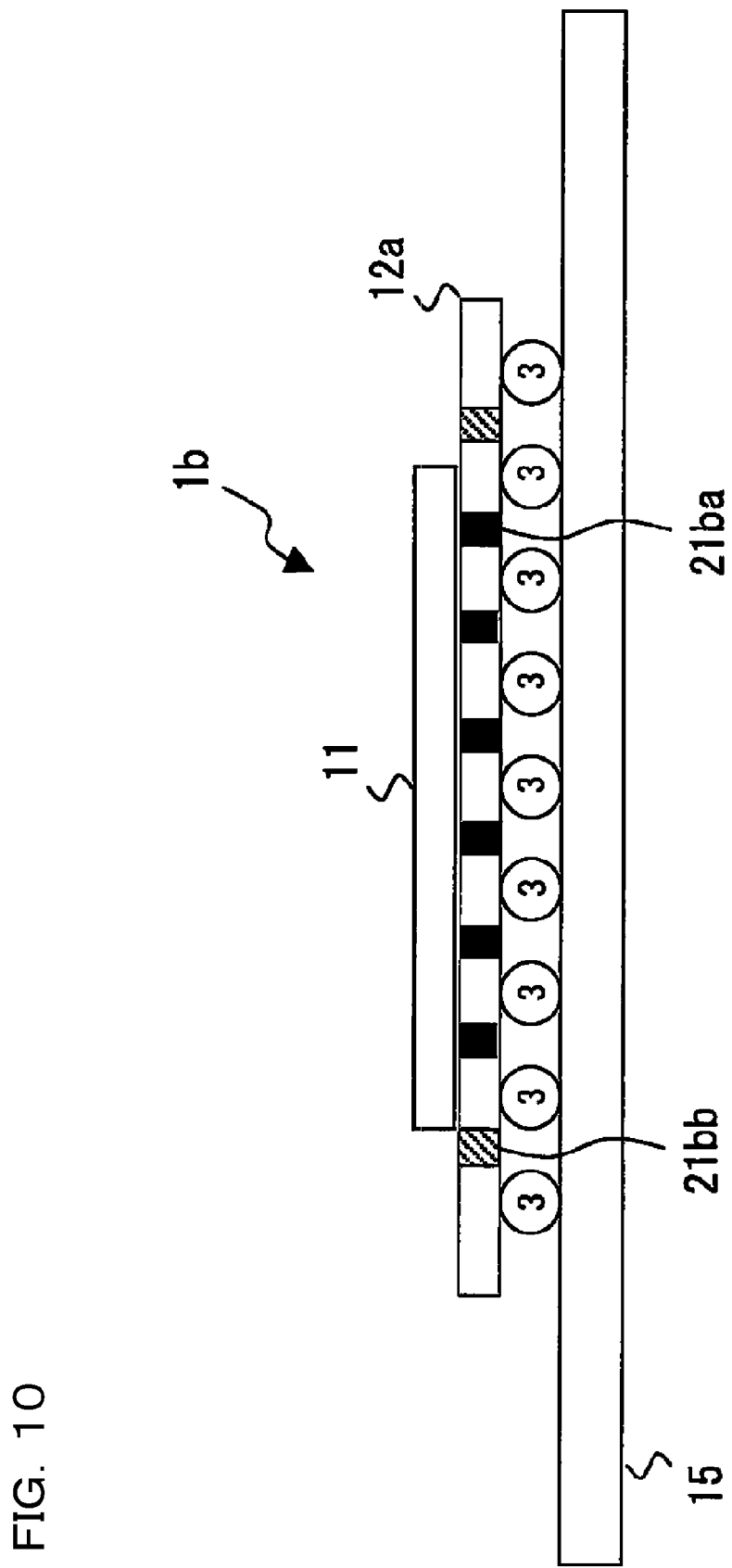
FIG. 10 is a section view illustrating an example of the configuration of a BGA package according to a second embodiment.

FIG. 10 is a section view illustrating an example of the configuration of a BGA package according to a second embodiment. In the BGA package 1b illustrated in FIG. 10, the same reference numerals as those in FIG. 1 are given to the same or equivalent components as those in FIG. 1, and the description thereon will be omitted herein. The BGA substrate 12b is similar to the BGA substrate 12a except for different holes.

Figure 11:
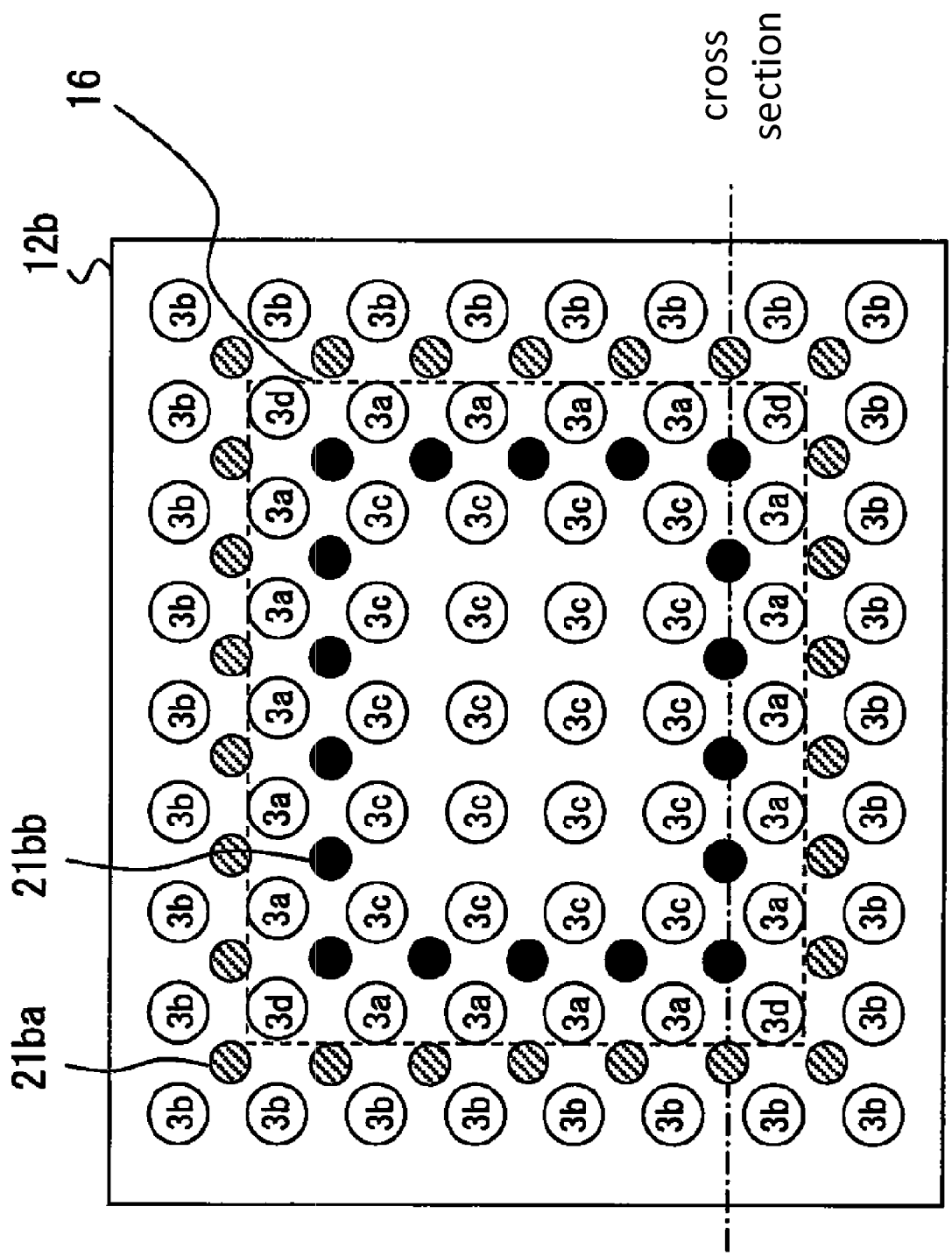
FIG. 11 is a bottom view illustrating an example of the configuration of a BGA substrate of the second embodiment.

FIG. 11 is a bottom view illustrating an example of the configuration of a BGA substrate of the second embodiment. In FIG. 11, the same reference numerals as those in FIG. 2 are given to the same or equivalent components as those in FIG. 2, and the description thereon will be omitted herein. FIG. 10 is a section view taken along the cut plane in FIG. 11.

On the BGA substrate 12b, a through hole 21ba is provided at the center of four solder balls 3, which are neighboring each other, including the solder ball 3a or solder ball 3d and the solder ball 3b, which is internally neighboring it. A through hole 21bb is provided at the center of four solder balls 3, which are neighboring each other, including the solder ball 3a or solder ball 3d and the solder ball 3c, which is externally neighboring it. In FIG. 10 and FIG. 11, the through holes 21ba are indicated by the black circles, and the through holes 21bb are indicated by the shaded circles.

Here, the plural through holes 21ba have electrodes on their inner surfaces. In this case, the electrodes of the chip 11 and the solder balls 3 are wired through electrodes (or vias) of the through holes 21ba. Notably, a part of the plural through hole 21ba may have electrodes. A part or all of the plural through hole 21bb may have electrodes.

According to this embodiment, the innermost square of the squares formed by connecting the centers of the solder balls outside of the solder ball boundary is called outside solder ball boundary (second boundary). The innermost square of the squares formed by connecting the centers of the solder balls inside of the solder ball boundary is called inside solder ball boundary (third boundary). The area between the outside solder ball boundary and the inside solder ball boundary is called chip peripheral area.

On the BGA substrate 12b, the layout of the through holes 21ba and 21bb as described above allows a higher density of the through holes in the chip peripheral area than the density of the through holes in the area excluding the chip peripheral area. Here, in a specific area of the BGA substrate 12b, a total size of the openings of the through holes within the specific area to the size of the plane of the specific area will be called surface density of the through holes. In this case, the layout of the through holes 21ba and 21bb as described above allows, on the BGA substrate 12b, a higher surface density of the through holes in the chip peripheral area is higher than the surface density of the through holes in the area excluding the chip peripheral area.

The layout of the through holes 21ba and 21bb as described above may reduce intensive stress and distortions on the chip boundary and may thus prevent the peel of the solder balls 3a and 3d.

The BGA substrate 12b is designed by the same substrate design apparatus and BGA substrate design method as in the first embodiment. Here, the predetermined positions in the chip peripheral area are the positions of the through holes 21ba and 21bb.

Third Embodiment

Figure 12:
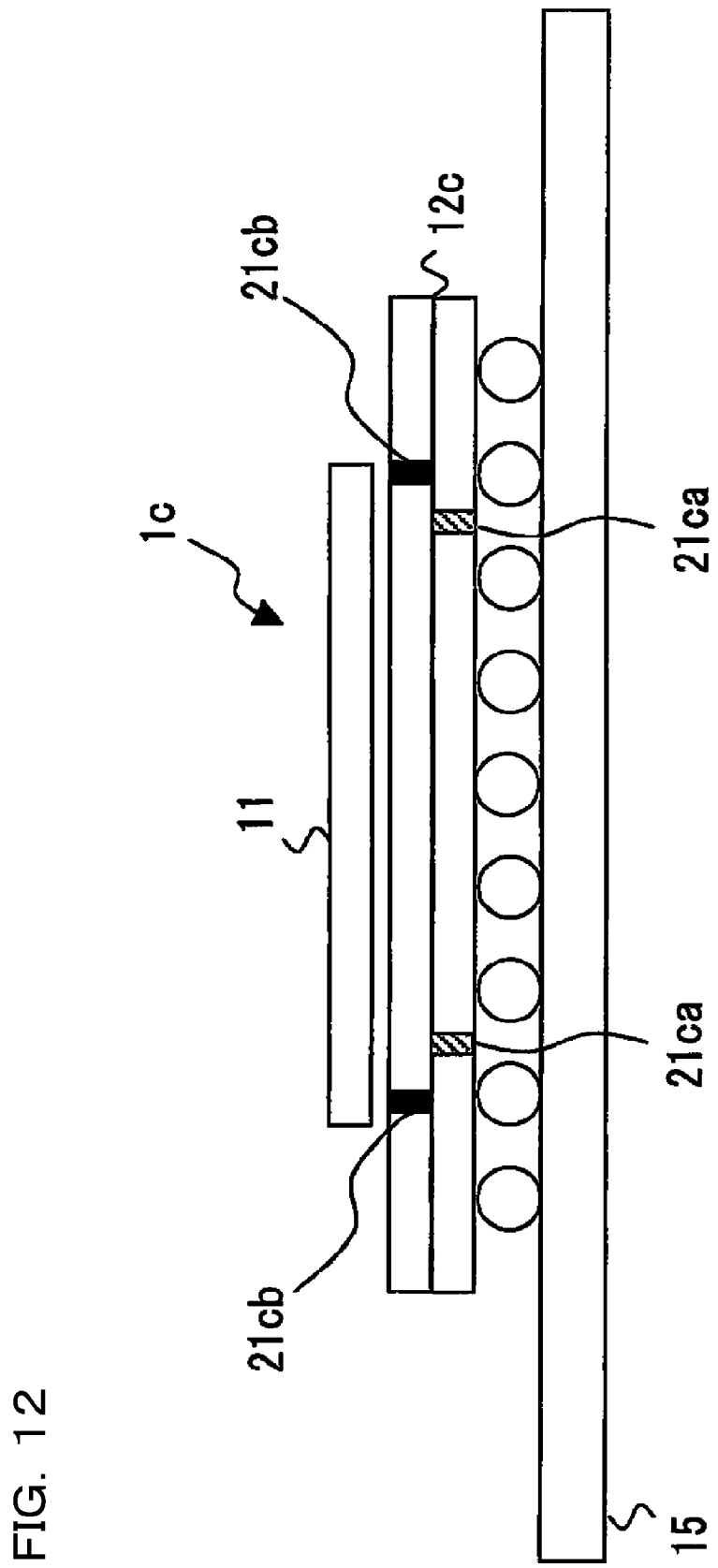
FIG. 12 is a section view illustrating an example of the configuration of a BGA package according to a third embodiment.

FIG. 12 is a section view illustrating an example of the configuration of a BGA package according to a third embodiment. In the BGA package 1c illustrated in FIG. 12, the same reference numerals as those in FIG. 1 are given to the same or equivalent components as those in FIG. 1, and the description thereon will be omitted herein. The BGA substrate 12c is similar to the BGA substrate 12a except that it is a multi-layered substrate and has different holes.

Figure 13:
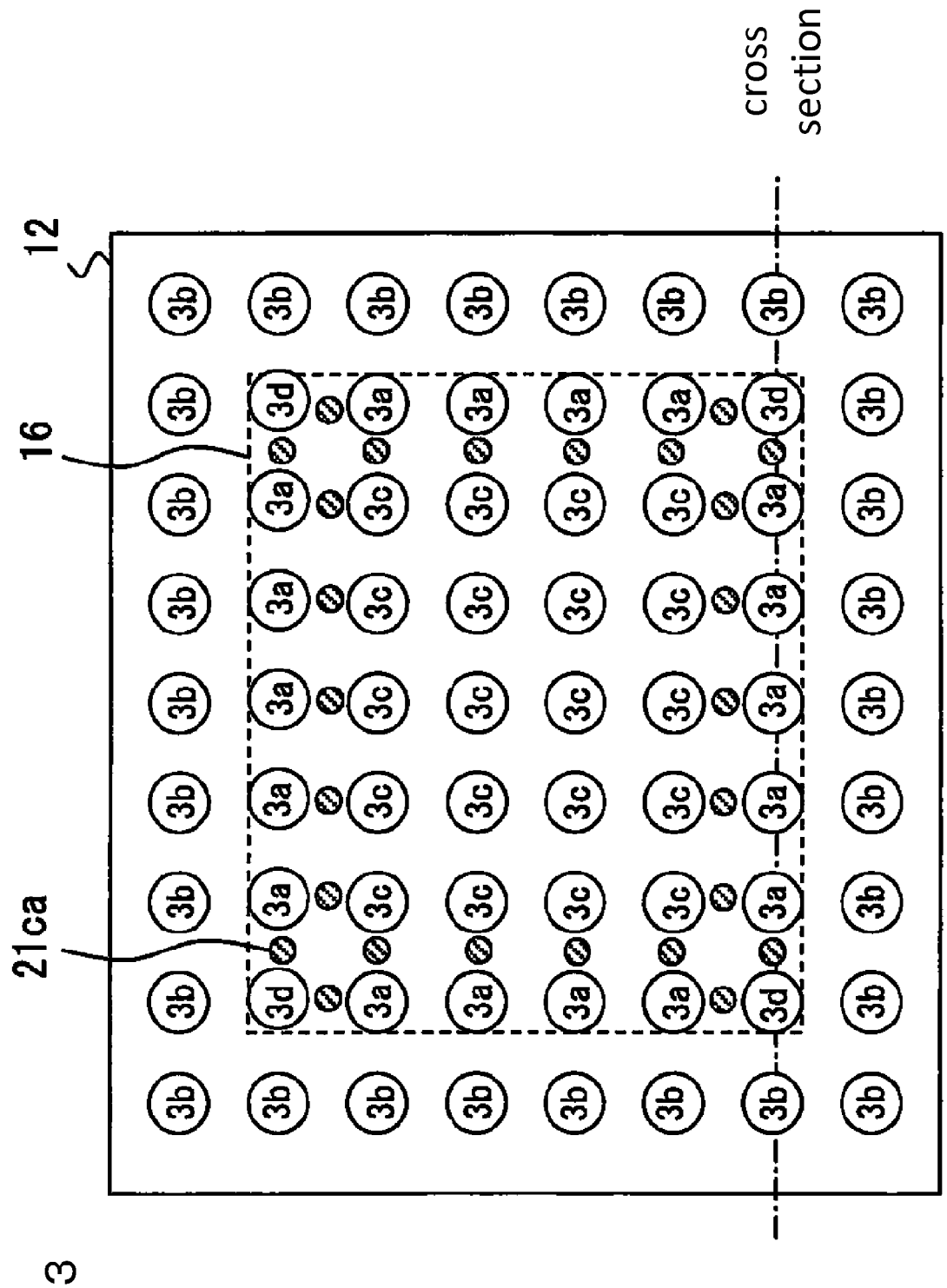
FIG. 13 is a bottom view illustrating an example of the configuration of a BGA substrate of the third embodiment.

FIG. 13 is a bottom view illustrating an example of the configuration of a BGA substrate of the third embodiment. In FIG. 13, the same reference numerals as those in FIG. 2 are given to the same or equivalent components as those in FIG. 2, and the description thereon will be omitted herein. FIG. 12 is a section view taken along the cut plane in FIG. 13.

On the bottom surface of the BGA substrate 12c, an inner via (which may be called blind hole or buried hole) 21ca is provided between a solder ball 3a and a solder ball 3b which is internally neighboring it. Furthermore, an inner via 21ca is provided between a solder ball 3d and a solder ball 3a which is neighboring it. On the top surface of the BGA substrate 12c, an inner via 21cb is provided at a position away from the inner via 21ca. In FIG. 12 and FIG. 13, the through holes 21ca are indicated by shaded circles, and the through hole 21cb are indicated by the black circles.

Here, a part or all of the plural inner vias 21ca and 21ca may have electrodes on their inner surfaces. In this case, the electrodes of the chip 11 and the solder balls 3 are wired through the electrodes of the inner vias 21cb, the electrodes in the inner layer of the BGA substrate 12c, and the electrodes of the inner vias 21ca.

In the description according to this embodiment, the area which is inside of the solder ball boundary and has a distance equal to or shorter than the solder ball distance D from the solder ball boundary is called chip peripheral area. The area, which is within the chip peripheral area and has a distance equal to or shorter than the solder ball distance D from two neighboring sides of the solder ball boundary (that is, the area which is within the chip peripheral area and is surrounded by the centers of four solder balls being neighboring to each other and including a solder ball 3d) will be called corner area.

On the BGA substrate 12c, the layout of the inner vias 21ca as described above allows a higher density of the inner vias in the chip peripheral area than the density of the inner vias in the area excluding the chip peripheral area. Furthermore, on the BGA substrate 12c, the density of the inner vias in the corner area is higher than the density of the inner vias in the chip peripheral area excluding the corner area. Here, in a specific area of the BGA substrate 12c, a total size of the openings of the inner vias within the specific area to the size of the plane of the specific area will be called surface density of the inner vias. In this case, on the BGA substrate 12c, the layout of the inner via 21ca as described above allows a higher surface density of the inner vias in the chip peripheral area than the surface density of the inner vias in the area excluding the chip peripheral area. Furthermore, on the BGA substrate 12c, the surface density of the inner vias in the corner area is higher than the surface density of the inner vias in the chip peripheral area excluding the corner area.

The layout of the inner vias 21ca as described above may reduce intensive stress and distortions on the chip boundary, particularly, near a corner of the chip boundary and may thus prevent the peel of the solder balls 3a and 3d.

The BGA substrate 12c is designed by the same substrate design apparatus and BGA substrate design method as in the first embodiment. Here, the predetermined positions in the chip peripheral area are the positions of the inner vias 21ca.

According to the embodiments, the stress reduction effect with the through holes or inner vias decreases when the rigidity of the entire BGA substrate is high and increases as the flexibility of a material of the substrate increases.

Figure 14:
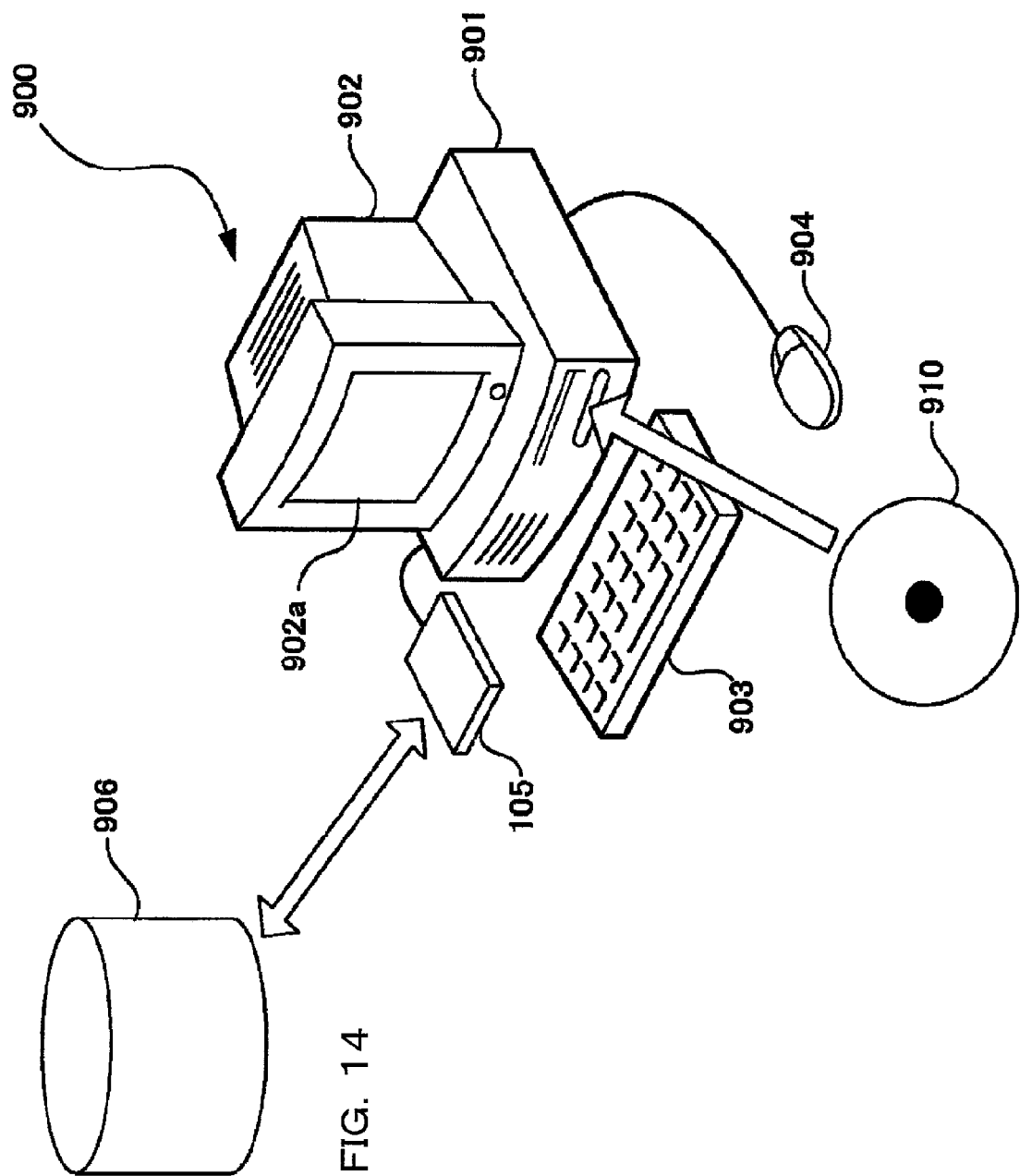
FIG. 14 is a diagram illustrating an example of the computer system.

Notably, the embodiments are applicable to the computer systems which will be described below. FIG. 14 is a diagram illustrating an example of the computer system to which the embodiments are applicable. The illustrated computer system 900 includes a body unit 901 internally having a CPU and a disk drive, a display 902 that displays an image in accordance with an instruction from the body unit 901, a keyboard 903 for inputting various information to the computer system 900, a mouse 904 for designating an arbitrary position on a display screen 902a of the display 902, and a communication device 905 that accesses an external database, for example, and downloads a program stored in a different computer system. The communication device 905 may be a network communication card or a modem, for example.

A program that implements the steps described above in a computer system applying in the substrate design apparatus as described above may be provided as a substrate design program. The program may be stored in a recording medium readable by the computer system so that it may be executed by the computer system applying the substrate design apparatus. The program that implements the steps may be stored in a portable recording medium such as the disk 910 or may be downloaded from a recording medium 906 in other computer system through the communication device 905. The substrate design program that provides at least the substrate design function to the computer system 900 is input to the computer system 900 and is compiled therein. The program causes the computer system 900 to operate as the substrate design system having the substrate design function. The program may be stored in a computer-readable recording medium such as the disk 910. Here, the recording media readable by the computer system 900 may include an internal storage device to be internally implemented in a computer, such as a ROM and a RAM, a portable storage medium such as the disk 910, a flexible disk, a DVD, a magneto-optical disk and an IC card, a database holding a computer program, other computer system and its database, and a recording medium accessible by a computer system connectable through communication means such as the communication device 905.

The embodiments may be implemented in other various forms without departing from the spirit and essential characteristics thereof. Therefore, the embodiments are given for the illustration purposes only in any points and should not be interpreted limitedly. The scope of the present invention is defined by the claims and is not confined by the description in the specification at all. Furthermore, all changes and various improvements, alterations and modifications belonging to the equivalents of the claims are all included within the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
    a substrate comprising a plurality of holes formed in a mounting surface thereof; and
    a semiconductor chip directly mounted on the mounting surface of the substrate, wherein
    said mounting surface comprises a first portion and a second portion, said plurality of holes comprises a first plurality of holes formed in the first portion and a second plurality of holes formed in the second portion, the substrate includes a greater density of the first plurality of holes than density of the second plurality of holes, the density being defined based on an area ratio in the respective portions of the mounting surface, the first portion is an area of a peripheral ring having a uniform width and having an outer perimeter defined by a solder ball boundary, the uniform width is equal to a uniform pitch of solder balls forming the solder ball boundary in the peripheral ring, and the second portion is a portion of the mounting surface that does not include the first portion of the substrate.

2. The semiconductor apparatus according to claim 1, wherein the semiconductor chip comprises a plurality of signal terminals, and the substrate has a first surface, which is the mounting surface on which the semiconductor chip is mounted and has plural first electrodes connected to the signal terminals, a second surface, which is the back surface of the first surface and has plural second electrodes connectable to an external substrate, and a plurality of wires that connect the first electrodes and the second electrodes through the plurality of holes.

3. The semiconductor apparatus according to claim 2, wherein, on the substrate, a first boundary, which is a boundary of the area facing the semiconductor chip, is a square.

4. The semiconductor apparatus according to claim 3, wherein the first portion is a portion which is inside of the first boundary and has a distance equal to or shorter than a predetermined first distance from the first boundary.

5. The semiconductor apparatus according to claim 4, wherein the first distance is a minimum distance between the second electrodes.

6. The semiconductor apparatus according to claim 4, wherein the holes in the first portion are provided at the positions at an equal distance from two, which are neighboring each other, of the second electrodes.

7. The semiconductor apparatus according to claim 4, wherein said substrate further comprises a third portion, which is a portion of the substrate within the first portion and has a distance equal to or shorter than a predetermined second distance from two sides, which are neighboring each other, said plurality of holes further comprises a third plurality of holes formed in the third portion, and the substrate includes a greater density of the third plurality of holes than density on the substrate surface of the holes provided in the portion excluding the third portion in the first portion.

8. The semiconductor apparatus according to claim 7, wherein the second distance is a minimum distance between the second electrodes.

9. The semiconductor apparatus according to claim 3, wherein the first portion is a portion between a second boundary, which is an innermost square of the squares formed by connecting the centers of the second electrodes outside of the first boundary and a third boundary, which is an outermost square of the squares formed by connecting the centers of the second electrodes inside of the first boundary.

10. The semiconductor apparatus according to claim 9, wherein the holes in the first portion are provided at the positions at an equal distance from four, which are neighboring each other, of the second electrodes.

11. The semiconductor apparatus according to claim 2, wherein the wires extend through the holes in the first portion.

12. The semiconductor apparatus according to claim 2, wherein the holes in the first portion extend between the first surface and the second surface.

13. The semiconductor apparatus according to claim 2, wherein:

the substrate is a multi-layered substrate; and the holes in the first portion have openings of the holes on the first surface or the second surface.

14. The semiconductor apparatus according to claim 2, wherein the first portion is a portion within the substrate and has a distance equal to or shorter than a predetermined first distance from the first boundary.

* * * * *